United States Patent
Holuigue et al.

(10) Patent No.: US 7,495,485 B2
(45) Date of Patent: Feb. 24, 2009

(54) CONTROLLABLE CURRENT SOURCE FOR A PHASE LOCKED LOOP

(75) Inventors: Christophe Holuigue, München (DE); Martin Gröpl, Sonthofen (DE)

(73) Assignee: National Semiconductor Germany AG, Unterhaching (DE)

(*) Notice: Subject to any disclaimer, the term of this patent is extended or adjusted under 35 U.S.C. 154(b) by 0 days.

(21) Appl. No.: 11/736,240

(22) Filed: Apr. 17, 2007

(65) Prior Publication Data

US 2007/0279114 A1 Dec. 6, 2007

(30) Foreign Application Priority Data

Apr. 19, 2006 (DE) .................. 10 2006 018 236

(51) Int. Cl.
*H03L 7/06* (2006.01)

(52) U.S. Cl. ........................ 327/157; 327/148

(58) Field of Classification Search .................. None
See application file for complete search history.

(56) References Cited

U.S. PATENT DOCUMENTS

| | | | | |
|---|---|---|---|---|
| 6,054,882 A * | 4/2000 | Izumikawa | .................. | 327/157 |
| 6,469,554 B1 * | 10/2002 | Harpham | .................... | 327/157 |
| 6,473,485 B1 * | 10/2002 | Fernandez-Texon | ......... | 377/27 |
| 6,778,026 B2 * | 8/2004 | Cheah et al. | .................. | 331/17 |
| 6,952,126 B2 * | 10/2005 | Byun et al. | .................. | 327/157 |
| 6,975,840 B2 * | 12/2005 | Lin | .............................. | 455/76 |
| 6,980,038 B2 * | 12/2005 | Boerstler et al. | ............ | 327/157 |
| 7,015,736 B1 | 3/2006 | Sudjian et al. | | |
| 7,061,290 B2 * | 6/2006 | Hasegawa | .................... | 327/157 |
| 7,365,593 B1 * | 4/2008 | Swanson | ..................... | 327/536 |
| 2001/0052811 A1 * | 12/2001 | Kim | ........................... | 327/536 |
| 2005/0162213 A1 * | 7/2005 | Yoshimura | .................. | 327/536 |
| 2006/0055450 A1 * | 3/2006 | Gu | .............................. | 327/536 |

FOREIGN PATENT DOCUMENTS

| | | |
|---|---|---|
| EP | 1 014 586 A2 | 6/2000 |
| EP | 1 037 366 A2 | 9/2000 |
| WO | WO 2005/020438 A1 | 3/2005 |

* cited by examiner

*Primary Examiner*—Cassandra Cox
(74) *Attorney, Agent, or Firm*—Pearne & Gordon LLP

(57) ABSTRACT

The invention concerns a controllable current source or "charge pump" (12) in an integrated circuit, comprising two supply terminals (K1, K2) for the application of two supply potentials (V1, V2) as well as an output terminal (Kout) for the delivery of an output current, connected via a first controllable current path (T1) with the first supply terminal (K1), and via a second controllable current path (T2) with the second supply terminal (K2). In order to improve the current source (12) with regard to the quality of the output signal, it is provided according to the invention that the controllable current source (12) furthermore has a replica (T1', T2') of the current paths (T1, T2) in their non-controlled state, of which a replica output terminal (Kout') is connected via a current mirror (T5 to T8) with the output terminal (Kout).

2 Claims, 3 Drawing Sheets

CONTROLLABLE CURRENT SOURCE FOR A PHASE LOCKED LOOP

BACKGROUND OF THE INVENTION

1. Field of the Invention

The present invention relates to a controllable current source, often also designated a "charge pump", in an integrated circuit, comprising a first and a second supply terminal for the application of a first and a second supply potential respectively, and an output terminal for the delivery of an output current, connected via a first controllable current path with the first supply terminal, and via a second controllable current path with the second supply terminal.

Furthermore the invention concerns integrated circuit arrangements in which a current source of this kind is used.

2. Description of the Prior Art

A controllable current source is for example from EP 1 037 366 A2 of known art, and comprises two supply terminals for the application of two supply potentials as well as an output terminal for the delivery of an output current, wherein the output terminal is connected via a first controllable current path with the first of the supply terminals and via a second controllable current path with the second of the two supply terminals.

The task for a current source of this kind consists in providing at an output terminal an output current that is dependent on input signals (current control signals), and can be positive or negative, i.e. can flow in or out of the output terminal. The current control signals often take the form of two digital voltage signals, wherein one of the signals ("up signal") is activated to deliver a positive current and the other current control signal ("down signal") is activated to deliver a negative current.

A general disadvantage of current sources of known art of this kind consists in the fact that even in the switched-out state a more or less large leakage current flows via their current paths and an ensuing leakage current difference distorts the output signal. In the current source of known art from EP 1 037 366 A2 an additional disadvantage consists in that in each case to form the controllable current paths a series circuit of transistors is provided such that the circuit arrangement requires a relatively large supply voltage (difference between the two supply potentials). The trend in microelectronic circuits, however, is towards ever-smaller supply voltages.

SUMMARY OF THE INVENTION

It is an object of the present invention to improve a controllable current source of the kind cited in the introduction with regard to the quality of the output signal.

This object is substantially achieved by a controllable current source characterized in that the controllable current source has furthermore a replica of the current paths in their non-controlled state, of which a replica output terminal is connected via a current mirror with the output terminal. The dependent claims concern advantageous further developments of the invention.

For the invention it is essential that the controllable current source furthermore has a replica of the current paths in their non-controlled state, of which a replica output terminal is connected with the output terminal via a current mirror. In this manner it is possible to compensate for any leakage currents that would falsify the output signal of the current source. Here the term "replica" designates a part of the integrated circuit that essentially has the same electrical properties as the current paths provided for the generation of the output current in their non-controlled state. Preferably an identical copy of these current paths is simply provided as a replica.

The object of the replica is to provide leakage currents on its replicated current paths that correspond to those of the "original" current paths. In this manner a replicated leakage current difference is provided to the replica output terminal that corresponds to the difference of the "original leakage currents" distorting the output signal.

The current mirror ensures that the leakage current difference generated in the replica is superimposed with the correct sign at the output terminal such that at this point a leakage current compensation takes place.

The two controllable current paths can be formed in a manner of known art by a transistor, in particular a field effect transistor (FET), at whose control input a current control signal is applied.

In a particularly preferred form of embodiment exactly one transistor, and in particular its controllable transistor channel, is arranged in each current path. This embodiment possesses the advantage that the current source can be operated with a relatively low supply voltage (e.g. smaller than 3V). Moreover a particularly large control range ("output swing") advantageously ensues for the current source. In this configuration the leakage currents, and in particular the leakage current difference acting on the output signal, are in fact larger in principle, but are, however, compensated for by the arrangement of a replica according to the invention.

In a preferred form of embodiment each of the controllable current paths is controlled by a digital current control signal ("up signal" and "down signal"). If the current path comprises a transistor or consists of a transistor, then the digital current control signal can e.g. cause the control terminal (e.g. gate connection) of the transistor to be connected with a channel connection to switch out the transistor, and to be connected with a prescribed adjusting potential to switch on the transistor. This adjusting potential can e.g. be provided at the control terminal of a transistor through which a reference current flows. The connection of the control terminal of the current path transistor with various potentials as required as a function of the digital current control signal can in turn be implemented in a simple manner by a switching transistor arrangement.

The integrated circuit arrangement can e.g. be formed in CMOS technology, wherein the two current paths are formed by FETs with different types of conductivity.

The two supply potentials of the controllable current source preferably take the form of supply potentials of the integrated circuit. It is however in principle conceivable that at least one of the two supply potentials of the current source is derived from a suitable supply potential of the total circuit.

For the design of the current mirror used in the invention the person skilled in the art can refer back to numerous concepts known per se. In a preferred form of embodiment the current mirror comprises a first series circuit of transistors that are connected with one another via a first circuit node at which the replica output current is fed in, and a second series circuit of transistors that are connected with one another via a second circuit node that forms an output terminal of the current mirror, wherein control inputs of the transistors are connected with one another in pairs for the desired current mirroring.

In a form of embodiment it is provided that the integrated circuit comprises a phase locked loop, in which a controllable current source of the kind described above is provided for at least indirect control of a controllable oscillator of the phase locked loop. The improvement in quality of the control source achieved with the leakage current compensation according to the invention leads in this case to a significant improvement of the properties of the phase locked loop concerned. For this reason the use of a current source according to the invention in a phase locked loop is in practice a particularly interesting instance of application.

In a further development of the invention in which the controllable current source is provided for the control of a voltage controlled oscillator (e.g. as a component of a phase locked loop) it is advantageous if a supply voltage of the current mirror is adjusted as a function of a voltage or a potential that is tapped in the region of the oscillator. With this measure it is possible during the operation of the oscillator to take into account fluctuations in potential occurring at an oscillator control input in the generation of the compensation current, that is to say, the current mirroring. In this connection the fact that the leakage currents flowing through the controllable current paths of the current source in practice depend more or less strongly on the potential of the output node is to be taken into consideration. It is therefore beneficial if, by means of the adjustment of the current mirror referred to, it is ensured that the replica of the two current paths also "sees" such fluctuations in potential.

BRIEF DESCRIPTION OF THE DRAWINGS

In what follows the invention is further described with the aid of examples of embodiment with reference to the accompanying drawings. In the figures.

DESCRIPTION OF THE PREFERRED EMBODIMENT(S)

Figure 1:
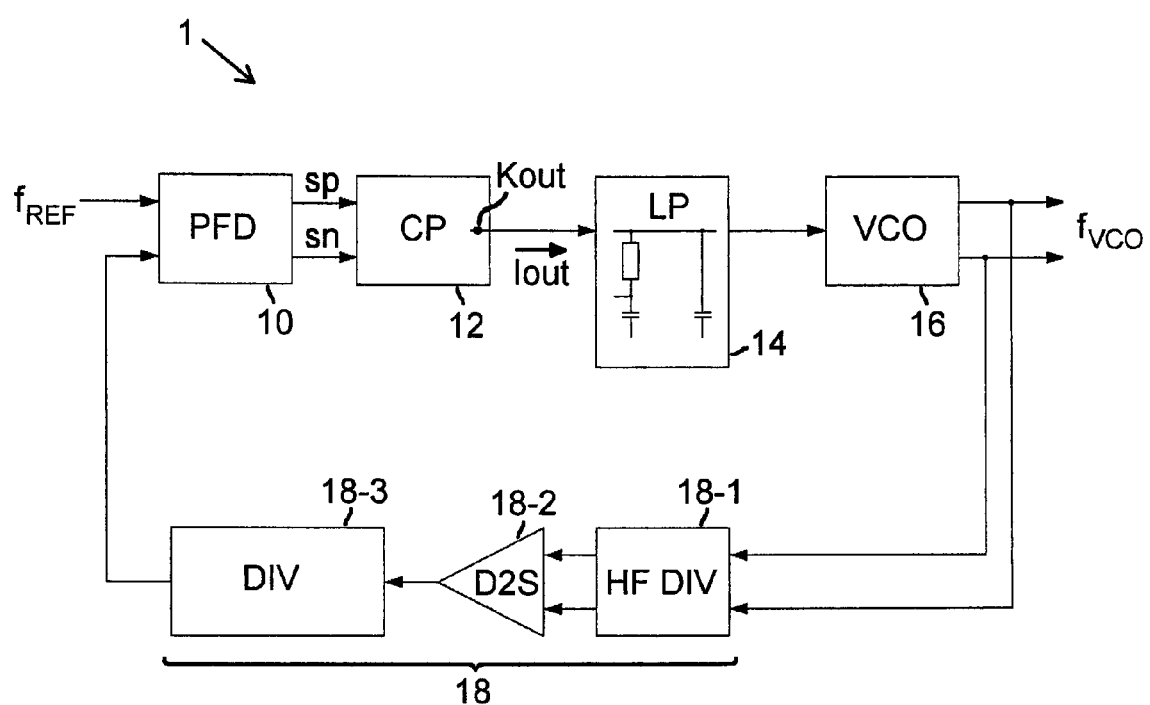
FIG. 1 shows a block circuit diagram of a phase locked loop (PLL)

FIG. 1 shows a phase locked loop, in what follows also designated as "PLL".

The PLL 1 comprises a phase detector 10, a controllable current source 12, an analog filter 14, a voltage-controlled oscillator 16, in what follows also designated as "VCO", and a feedback arrangement 18.

The PLL 1 serves in a manner known per se to control the VCO 16 for the output of an output signal with a frequency $f_{VCO}$ that stands in a fixed ratio to a frequency $f_{REF}$ of an input signal supplied to the PLL 1, and in particular is e.g. identical to this frequency.

The PLL 1 functions as follows. The input signal with the frequency $f_{REF}$ and a feedback signal outputted from the feedback arrangement 18 are supplied to the phase detector 10. The phase detector 10 detects any phase difference between the two supplied signals and outputs at its output as a function of the phase difference two digital signals sp, sn, which are supplied to the controllable current source 12 as current control signals. These current control signals sp, sn take the form of short pulses for the generation of a positive (signal sp) or negative (signal sn) current at the output node Kout of the current source 12.

Here, according to the configuration of the phase detector 10 and the current source 12, it is not excluded, and is indeed often sensible, that at certain time intervals both control signals sp, sn are outputted simultaneously, and/or the corresponding control signal pulses partly overlap each other in time.

The output current Iout outputted by the current source 12 is supplied to the analog passive filter ("loop filter") 14. The filter 14 possesses an integrator characteristic and converts the supplied current signal Iout into a voltage signal. This voltage signal is supplied to the VCO 16 for the adjustment of its oscillation frequency $f_{VCO}$.

A signal that is branched off at the output of the VCO 16 is fed back via a feedback arrangement 18 to the first of the two inputs of the phase detector 10. The output signal of the VCO 16 is thus regulated with regard to its frequency on the basis of the supplied frequency $f_{REF}$. In the form of embodiment represented periodically generated control signals sp, sn with variable pulse duration are outputted for this purpose to control the current source corresponding to the phase detection result. In the regulated ("locked") state the signals sp, sn are outputted simultaneously and with the same pulse width.

The PLL 1 here represented in exemplary form possesses on the one hand the particular feature that the output signal of the VCO 16 is provided differentially, and in the feedback path 18 is converted by a converter 18-2 into a non-differential ("single ended") signal, and on the other hand the particular feature that in the feedback arrangement 18 a frequency divider 18-1 and 18-3 is arranged in the signal routing before and behind the converter 18-2 respectively. The latter measure causes the oscillator frequency $f_{VCO}$ to be a multiple of the supplied reference frequency $f_{REF}$.

In what follows two examples of embodiment of the controllable current source 12 are described with reference to FIGS. 2 and 3.

Figure 2:
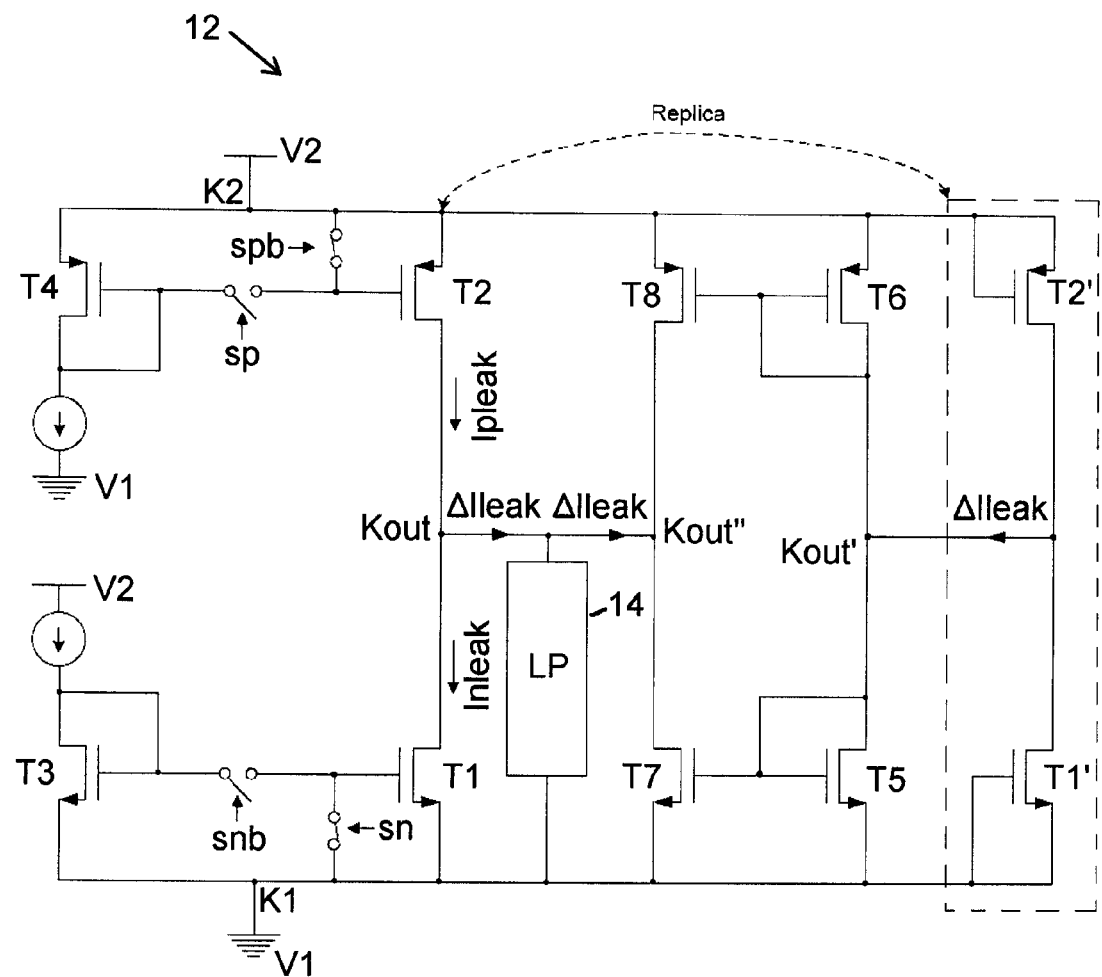
FIG. 2 shows a controllable current source used in the phase locked loop of FIG. 1 according to a first example of embodiment.

FIG. 2 shows a first example of embodiment of the controllable current source 12 together with the filter 14, indicated simply as a block, of the PLL 1.

The current source 12 comprises a first supply terminal K1 for the application of a first supply potential V1 and a second supply terminal K2 for the application of a second supply potential V2.

The current source 12 furthermore comprises an output terminal K2, connected via a first transistor T1 with the first supply terminal K1, and via a second transistor T2 with the second supply terminal K2. The output terminal K2 serves for the output of an output current of the current source 12 to the filter 14.

Each of the transistors T1, T2 forms a controllable current path between one of the supply terminals K1, K2 and the output terminal Kout.

These current paths are controlled by the current control signals sp, sn (cf. FIG. 1), wherein in the example of embodiment represented controllable switching elements are provided, each of which is switched by the current control signals sp, sn and/or by inverted signal versions spb, snb derived from the former.

In FIG. 2, for the purposes of simplicity of representation, the switching elements formed in each case e.g. from a switching transistor (e.g. FET) are indicated in a simplified manner as switches. Moreover those parts of the circuit that are provided for the inversion of the signals sp, sn (e.g. CMOS inverters) have been left out.

The switching state represented in FIG. 2 corresponds to the state in which the transistors T1, T2 are switched off. As a result the transistors T1, T2 have been brought into the blocking state, in that their gate connections in each case have been electrically connected via one of the switches with a corresponding channel connection.

If one of the transistors T1, T2 however should supply an output current to the output terminal Kout (T2 a positive current, T1 a negative current) then the gate connection of the transistor is connected via another switch with a gate connection of a reference transistor T3 or T4 respectively. In each case the supply potentials V1, V2 are applied to the channel connections of these two reference transistors T3, T4, and the latter in each case are operated in saturation mode by the connection of their gate connection with one of their channel connections. The reference transistors T3, T4 therefore act as reference current sources to define the currents that are supplied by the transistors T1 and T2 in the switched-on state to the output terminal Kout.

In the conducting state the transistors T1, T2 can supply a relatively large current. In the blocking state (FIG. 2) only low leakage currents Ipleak, Inleak flow through these transistors.

If the leakage current Ipleak flowing through the transistor T2 is not completely identical with the leakage current Inleak flowing through the transistor T1, which will usually be the case, even when the two transistors T1, T2 are well matched, then a difference between the two leakage currents, in the figure designated as ΔIleak, flows to the filter 14.

However, by means of the additional current source 12 components described in what follows, any disadvantageous effects on the functional properties of the PLL 1 of the leakage current difference ΔIleak flowing from the output terminal Kout to the filter 14 are avoided. These additional components serve, as represented in FIG. 2, to compensate for this leakage current difference by means of a current of the same magnitude that flows from the input of the filter 14 to a circuit node Kout".

The transistors T1', T2', arranged in a series circuit, to which the supply voltage (difference between V2 and V1) is applied in a manner similar to its application to the transistors T1, T2, are designed as a replica of the latter transistors T1, T2 in their non-activated state. In the example represented the transistor T2' is designed to be identical to the transistor T2, and the transistor T1' is designed to be identical to the transistor T1. The gate connections of these replica transistors T1', T2' are permanently connected with those of their gate connections by whose potential the respective transistor is brought into its blocking state. At a circuit node Kout' connecting these replica transistors T1', T2' with one another a leakage current difference is thus outputted, which corresponds to the leakage current difference ΔIleak flowing from the output node Kout to the filter 14.

The current outputted from the replica is mirrored at the circuit node Kout" (and matched in sign) by means of a current mirror, formed in a manner of known art by transistors T5, T6, T7 and T8, such that the current flowing from Kout to the filter 14 ultimately does not continue to flow into the filter 14 but to the circuit node Kout". In other words the leakage current difference ΔIleak at the output of the controllable current source 12, which in practice is unavoidable, is compensated for by a compensation current of equal magnitude. This compensation current is generated by a replica of the output stage T1, T2 and by means of the current mirror T5, T6, T7, T8 is superimposed with the correct sign to provide the compensation.

The transistors of the current mirror are, as represented, arranged as pairs T5, T6, and T7, T8, respectively, connected in series between the supply terminals K1, K2, wherein a circuit node located between the transistors T5 and T6 forms the input node Kout' of the current mirror, while the circuit node Kout" connecting the transistors T7 and T8 with one another forms the output node of the current mirror. Moreover each of the gate connections of the transistors T5, T6 is connected with one of the channel connections of these transistors, in order to operate these transistors in saturation mode. The transistor T7 is designed to be identical to the transistor T5 and the transistor T8 is designed to be identical to the transistor T6 (or at least with an identical relationship between channel length and channel width), in order to provide a 1:1 mirroring relationship.

Since the two current paths of the current source 12 in each case consist of a single transistor, T1 and T2 respectively, the supply voltage V2, V1 can be advantageously selected to be relatively low and, for example, can be less than 3V. Moreover by means of this simple configuration a large control range can be achieved (large maximum current strengths at the output terminal Kout). The larger leakage currents Ipleak, Inleak typical in this case also lead as a rule to a larger leakage current difference ΔIleak, wherein this leakage current difference is, however, advantageously compensated for by the measures described. The deterioration in performance properties of the PLL 1 that would be anticipated without such compensation (e.g. phase dither and other signal errors) is therefore drastically reduced.

Figure 3:
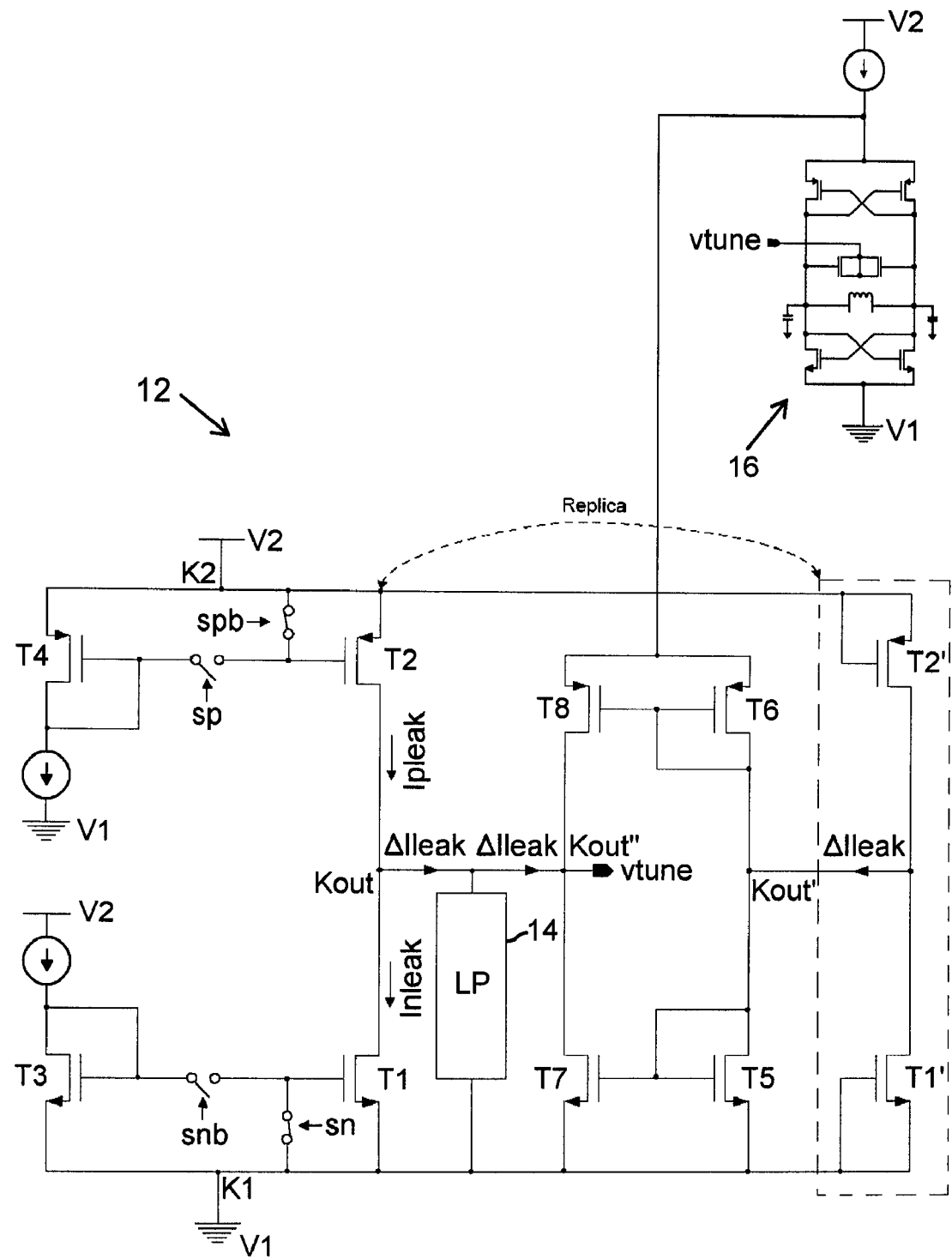
FIG. 3 shows a controllable current source according to a second example of embodiment.

FIG. 3 shows the circuit diagram of a modified form of embodiment.

Also included in FIG. 3 is the VCO 16 controlled by the current source 12, whose oscillation frequency $f_{VCO}$ is adjusted by means of a potential vtune prevailing at the output node Kout of the current source 12.

As can be seen from the figure, the VCO 16 comprises an oscillator arrangement of an inductance with two capacitances connected with it in series, as well as a voltage-controlled capacitance (varactor) connected with it in parallel. The oscillation frequency thus depends on the control signal supplied as a control potential vtune to the varactor. This control signal controls the oscillation frequency $f_{VCO}$ by alteration of the varactor capacitance.

The electrical losses occurring as a result of the oscillation are compensated for in a manner of known art by an arrangement of four FETs, which form a "negative resistance" for the system and are fed by a current source that is arranged between the supply potential V2 and a supply terminal of the VCO 16. Another supply terminal of the VCO 16 is connected with the other supply potential V1.

In the operation of the VCO 16 the potential vtune varies. Here this variation is also transferred with the same sign to a circuit node between the supply current source and the actual oscillator. This circuit node is, as can be seen from FIG. 3, connected with one of the two supply nodes of the current mirror T5, T6, T7, T8. The "entrainment" of the current mirror supply voltage that thus occurs has an advantageous effect on the accuracy of the generation and mirroring of the compensation current. The functionality of the leakage current compensation according to the invention is in this way improved further.

The configuration of the oscillator 16 represented is only to be understood as an example, of course, and can also be modified in practice.

In summary, a controllable current source is provided with the above described examples of embodiment, which source in particular is suitable for use in a phase locked loop.

The invention claimed is:

1. An integrated circuit, comprising a phase locked loop (1), in which a controllable current source (12) is provided for at least indirect control of a controllable oscillator (16) of the phase locked loop (1), wherein the controllable current source (12) comprises:

a first and a second supply terminal (K1, K2) for the application of a first and a second supply potential (V1, V2) respectively, an output terminal (Kout) for the delivery of an output current, connected via a first controllable current path (T1) with the first supply terminal (K1), and via a second controllable current path (T2) with the second supply terminal (K2), and a replica (T1', T2') of the current paths (T1, T2) in their non-controlled state, of which a replica output terminal (Kout') is connected via a current mirror (T5-T8) with the output terminal (Kout), and wherein a supply voltage of the current mirror (T5-T8) is adjusted as a function of a voltage or a potential that is tapped in the region of the oscillator (16).

2. The integrated circuit according to claim 1, wherein each of the controllable current paths (T1, T2) is formed by a transistor.

* * * * *